United States Patent
Banhegyesi et al.

(10) Patent No.: US 8,587,949 B2
(45) Date of Patent: Nov. 19, 2013

(54) ELECTRONIC METER HAVING USER-INTERFACE AND CENTRAL PROCESSING FUNCTIONALITY ON A SINGLE PRINTED CIRCUIT BOARD

(75) Inventors: Tibor Banhegyesi, Baldwin, NY (US); Erran Kagan, Great Neck, NY (US)

(73) Assignee: Electro Industries/Gauge Tech, Westbury, NY (US)

(*) Notice: Subject to any disclaimer, the term of this patent is extended or adjusted under 35 U.S.C. 154(b) by 1265 days.

(21) Appl. No.: 12/055,463

(22) Filed: Mar. 26, 2008

(65) Prior Publication Data

US 2008/0238713 A1    Oct. 2, 2008

Related U.S. Application Data

(60) Provisional application No. 60/920,198, filed on Mar. 27, 2007.

(51) Int. Cl.
*H05K 1/14*  (2006.01)
*H02B 1/03*  (2006.01)

(52) U.S. Cl.
USPC .. 361/736; 361/668; 340/870.02; 340/870.05

(58) Field of Classification Search
USPC ............... 340/870.02, 870.05; 361/736, 668
See application file for complete search history.

(56) References Cited

U.S. PATENT DOCUMENTS

| | | | |
|---|---|---|---|
| 4,791,362 A * | 12/1988 | Philpot | 324/142 |
| 6,555,997 B1 * | 4/2003 | De Vries et al. | 324/74 |
| 6,563,705 B1 * | 5/2003 | Kuo | 361/679.54 |
| 6,824,391 B2 * | 11/2004 | Mickievicz et al. | 439/61 |
| 6,838,955 B1 * | 1/2005 | Compton | 333/125 |
| 6,982,490 B1 * | 1/2006 | Dewey | 257/778 |
| 7,265,532 B2 * | 9/2007 | Karanam et al. | 324/142 |
| 7,274,187 B2 * | 9/2007 | Loy | 324/142 |
| 7,962,298 B2 * | 6/2011 | Przydatek et al. | 702/61 |

* cited by examiner

*Primary Examiner* — Rexford Barnie
*Assistant Examiner* — Zeev V Kitov
(74) *Attorney, Agent, or Firm* — Gerald E. Hespos; Michael J. Porco; Matthew T. Hespos

(57) ABSTRACT

A digital electrical power and energy meter integrates a primary processing module and a user interface module onto a single printed circuit board to reduce overall meter size, assembly time, and cost.

37 Claims, 7 Drawing Sheets

ELECTRONIC METER HAVING USER-INTERFACE AND CENTRAL PROCESSING FUNCTIONALITY ON A SINGLE PRINTED CIRCUIT BOARD

CROSS-REFERENCE TO RELATED PATENTS AND PATENT APPLICATIONS

This application claims priority to U.S. Provisional Patent Application No. 60/920,198, filed on Mar. 27, 2007, which is herein incorporated by reference.

FIELD

The present disclosure relates generally to the field of intelligent electronic devices for electrical utility services and, more specifically, to digital electrical power and energy meters for electrical utility services.

BACKGROUND

Producers, suppliers, and consumers of electrical power rely on energy meters to monitor power consumption and quality for numerous purposes, including billing, revenue, power distribution management, and process management. Traditionally, the primary means of measuring power consumption was an electromechanical power meter. A number of other types of meters and equipment measured other parameters of power generation, distribution, usage, and quality. As technology has improved, intelligent electronic devices (IEDs), such as digital power and energy meters, Programmable Logic Controllers (PLCs), electronically-controlled Remote Terminal Units (RTUs), protective relays, fault recorders, and the like, have slowly replaced their electromechanical and analog counterparts.

The shift to using IEDs instead of or in addition to analog and electromechanical devices provides a vast array of advantages including improvements in measurement accuracy (e.g., measurements of voltage, current, power consumption, power quality, etc.) and system control (e.g., allowing a meter to trip a relay or circuit breaker). As a result of the advent of digital metering, a single device can now implement functionality previously implemented in two or more separate devices. Communication enabled by digital processors allows devices to share information with each other, with remote terminals, and even directly with remote users via electronic mail and the World Wide Web.

Some of the functionality resulting from the improvements in technology may be implemented without increasing the number of components, and by extension the size, of the IED. Such is the case, for example, where a single microprocessor may be programmed to perform multiple functions. However, this is not always true. Some of the additional functions included in IEDs require specialized hardware. For example, the inclusion of a specialized communication interface, such as a fiber optic port or an infrared transceiver, requires specialized interface hardware. These and other functions may also require a specialized set of integrated circuits (ICs) (i.e., a chipset) to implement the unique communication protocols required. Moreover, some functions (or combinations of functions) require more processing power than a single processor can deliver, and other functions are more appropriately implemented on a specialized processor that is designed for a particular task or a particular type of processing. Additional processors and specialized hardware necessarily increase the size of the IED.

Despite the pace at which manufacturers release IEDs with new features and functionality, market pressure continues to favor smaller and, of course, less expensive devices. These types of improvements have been hampered because of physical space limitations on a printed circuit board. For example, traditional digital meters utilized Light Emitting Diodes (LEDs) for indication and a display of a user interface. These diodes, among other components were mounted onto a printed circuit board using through-hole technology. Through-hole technology refers to the mounting scheme used for electronic components that involves the use of pins on the components that are inserted into holes drilled in printed circuit boards (PCBs) and soldered to pads on the opposite side of the PCB. While through-hole mounting provides strong mechanical bonds, the additional drilling required makes the board more expensive to produce. It also limits the available routing area for signal traces on layers immediately below the top layer on multilayer boards since the holes must pass through all layers to the opposite side. Furthermore, components mounted by this technique makes it virtual impossible to mount additional components on the opposite side of the board.

Because of these limitations, multiple printed circuit boards needed to be used to support the display in addition to electronics and connectors. Often three or more printed circuit boards were used to support and/or accommodate the needed components. The boards generally included a display board connected to an electronics board using connectors. The electronics board which included a processor was then connected by an additional set of connectors to another board to hold interface connectors, a power supply, communication, etc. Due to the fact that all these connectors were used to connect the boards together, the space on these printed circuit boards was used inefficiently. This made the power meters bulky and large and difficult to retrofit within existing analog enclosures. Therefore, further improvements to intelligent electronic devices are desirable.

SUMMARY OF THE DISCLOSURE

A disclosed digital electrical power and energy meter is smaller and easier to assemble compared to other meters with similar features. Specifically, the meter includes a motherboard and a plurality of interface boards. The motherboard is a two-sided printed circuit board (PCB) having, on one side, a user interface for allowing an operator of the device to program and use the device. The other side of the motherboard contains the main processing hardware for the meter, and a plurality of connectors for communicatively coupling the motherboard to the plurality of interface boards. The present disclosure provides for techniques for mounting various components, e.g., a high density connector and display technology, to a multilayer board for example a single printed circuit board motherboard utilizing a very small footprint, which avoids the conventional technique of utilizing three printed circuit boards for the display board, the electronics board and connector board. Techniques of the present disclosure provide the user with an ability to utilize advanced technology such as a meter with Ethernet and expandable I/O that retro fits easily into existing enclosures wherein analog meters traditionally were used.

Figure 1A:
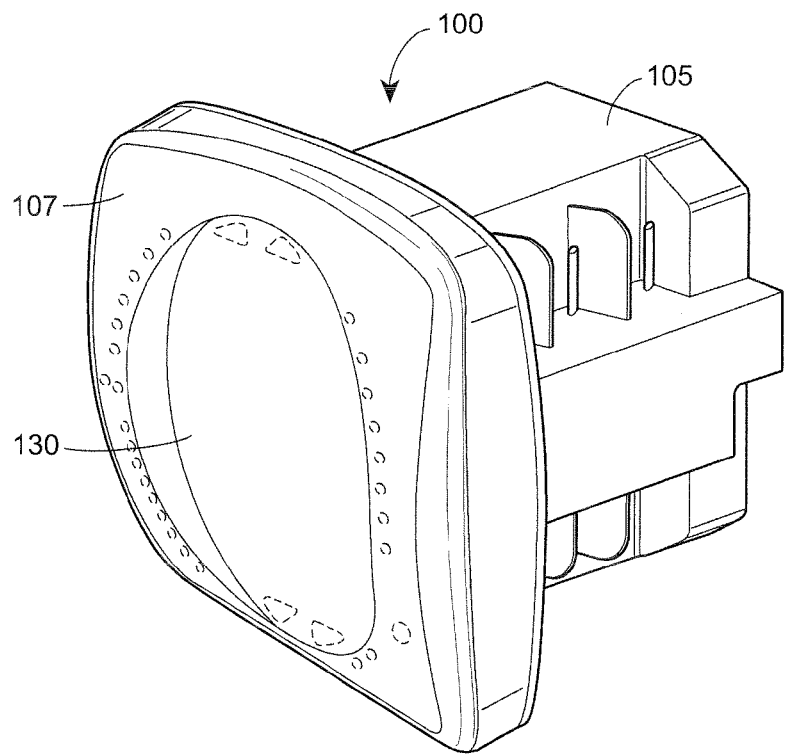
FIGS. 1A and 1B are perspective and rear elevation views, respectively, of an exemplary digital electrical power and energy meter.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. It is contemplated that features or steps of one embodiment may beneficially be incorporated in other embodiments without further recitation.

DETAILED DESCRIPTION

Although the following text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

While the figures and description herein are specifically directed to digital electrical power and energy meters, including revenue quality certified meters, the concepts disclosed in the present application may also be applied in the context of other types of Intelligent Electronic Devices (IEDs) including, for example, Programmable Logic Controllers (PLCs), Remote Terminal Units (RTUs), protective relays, fault recorders, and other devices or systems used to quantify, manage, and control quality, distribution, and consumption of electrical power. Thus, as used herein, the term "digital electrical power and energy meter" refers broadly to any IED adapted to record, measure, communicate, or act in response to one or more parameters of an electrical service. These parameters may include, for example, supply currents and supply voltages, their waveforms, harmonics, transients and other disturbances, and other corresponding parameters, such as power, power quality, energy, revenue, and the like. A variety of electrical service environments may employ IEDs and, in particular, digital electrical power and energy meters. By way of example and not limitation, these environments include power generation facilities (e.g., hydroelectric plants, nuclear power plants, etc.), power distribution networks and facilities, industrial process environments (e.g., factories, refineries, etc.), and backup generation facilities (e.g., backup generators for a hospital, a factory, etc.).

Figure 1B:
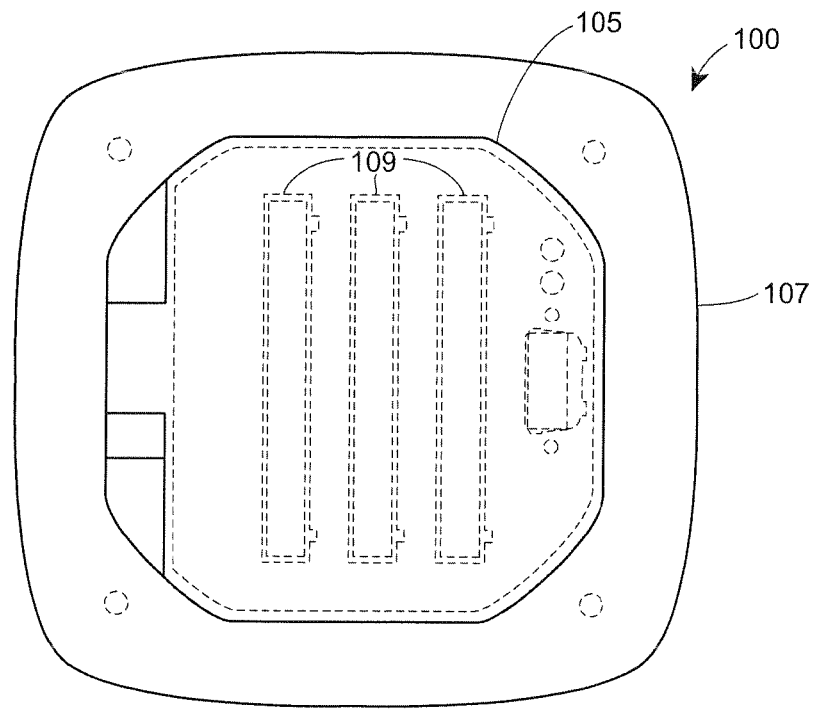

FIGS. 1A & 1B depict an exemplary digital electrical power and energy meter 100. The meter 100 generally comprises a plurality of modules, each module having a dedicated task. A meter housing 105 houses the modules, and is designed to allow a user to mount the meter 100 in a desired enclosure or other mounting location and to allow any necessary connection interfaces to be located outside of the meter housing 105 for easy setup. The meter housing 105 includes an opening or cover 107 for a user interface, and one or more openings 109 at a rear portion of the housing for inserting swappable modules (e.g., modules implementing various communication protocols, adding features to the meter, etc.) Further, the meter housing 105 may be designed to fit the enclosed modules, and may be designed to conform to an industry standard.

Figure 2:
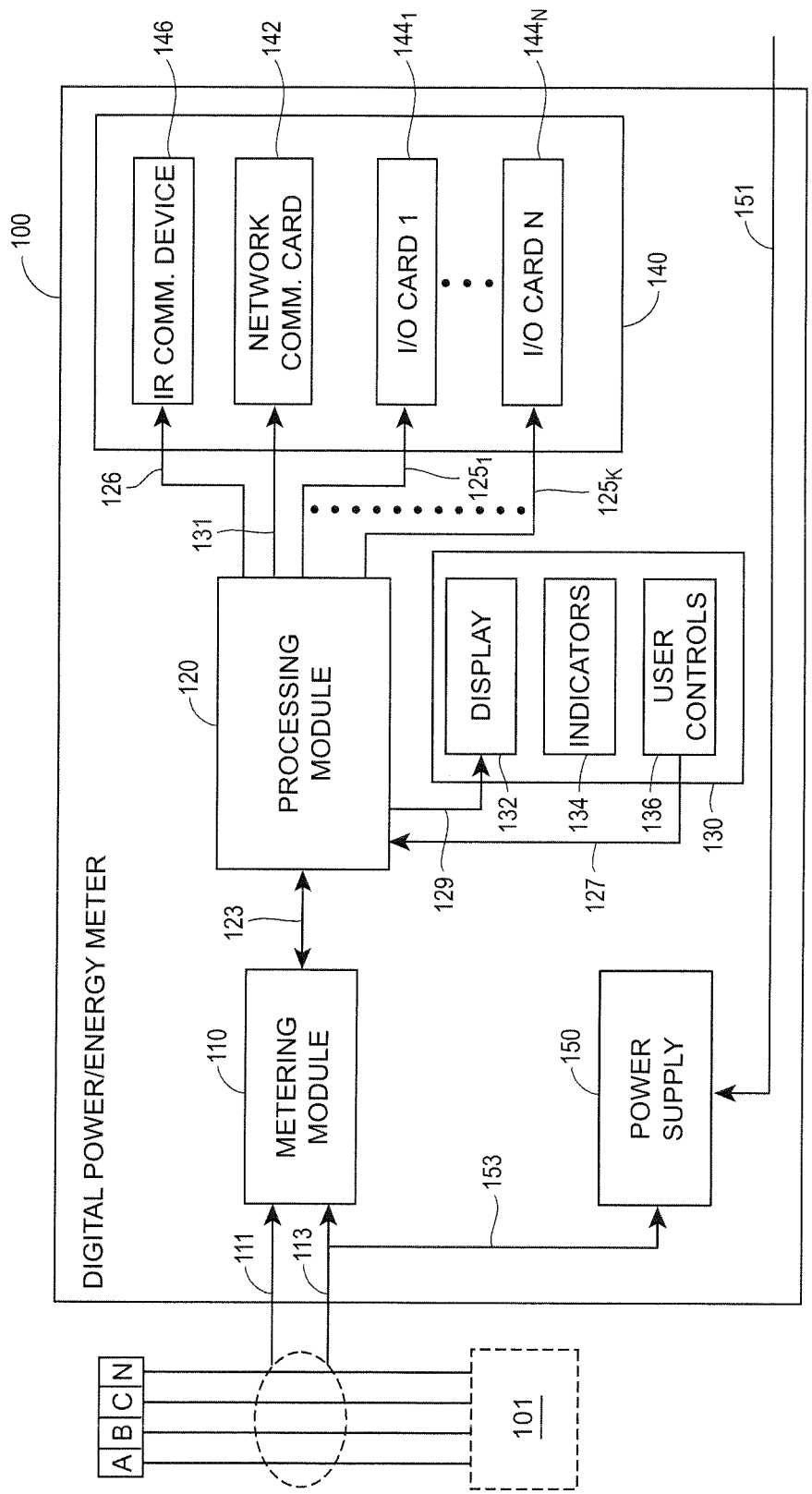
FIG. 2 is a block diagram of the exemplary digital electrical power and energy meter of FIGS. 1A and 1B.

FIG. 2 depicts a block diagram of the exemplary digital meter 100. A metering module 110 includes voltage and current sensing circuitry and, in the preferred embodiment, measures or calculates one or more parameters associated with the electrical load or service (e.g., voltage, current, energy, etc.). A processing module 120 facilitates operation and administration of the meter 100 and processes data obtained from the metering module 110. A user interface module 130 displays results of measurements and calculations and allows configuration of the meter 100, via a display 132, a plurality of indicators 134, and a plurality of user controls 136. A communications module 140 facilitates communication of data to one or more an external devices (not shown), couples the meter 100 to one or more remote terminals, and/or allows remote configuration of the meter 100. The communications module 140 includes an infrared communication device (and related circuitry) 146, and may optionally include a network communication card 142. The communications module 140 may also include one or more input/output (I/O) cards 144. A power supply module 150 provides power to the various components and modules of the meter 100.

While some of these modules (e.g., the metering module 110, the processing module 120, and the power supply module 150) may be required for operation of the meter 100, other modules in the illustrated embodiment are optional and may be omitted or replaced with different modules. Each of the modules 110, 130, 140, and 150 is connected to the processing module 120. The power supply 150 is coupled to each of the modules 110, 120, 130, and 140. Typically, a plurality of traces in the printed circuit boards (PCBs) within the meter connect the power supply 150 to the other modules of the meter 100, the various PCBs in the meter 100 being connected by a known method (e.g., card-edge connector, header/receptacle connector, etc.). The power supply 150 is also coupled to a source of power. For example, a connection 151 may couple the power supply 150 to an external power source (not shown), or a connection 153 may couple the power supply 150 directly to the electrical service 101. As used herein, the terms "coupled" and "connected" are defined to mean directly connected to or indirectly connected to through one or more intermediate components. Such intermediate components may include both hardware and software based components.

One or more interfaces connect each of the metering module 110, the user interface 130, and the communications module 140 to the processing module 120. For example, the interfaces 126, 131, and 125 connect the processing module 120 to the various sub-modules comprising the communications module 140 (e.g., the infrared communication device 146, the network communication card 142, and the I/O cards 144). The interfaces 127 and 129 connect the user interface 130 to the processing module 120. Likewise, the interface 123 connects the metering module 110 to the processing module 120. Each of the interfaces 123, 125, 126, 127, 129, 130, and 131 may be any suitable type of interface, and may be one or more similar or different interfaces. For example, in the presently described embodiment, the interface 123 includes a serial peripheral interface (SPI), a control interface, data and address buses, an energy test pulse (i.e., KYZ pulse) output, etc.

During normal operation, the metering module 110 is coupled to an electrical service 101 to be measured and/or monitored, such as the three-phase electrical service 101 of FIG. 2. A current interface 111 and a voltage interface 113 couple the meter 100 to supply lines A, B, C, and N of the electrical service 101. Each of the interfaces 111 and 113 may comprise a plurality of connections (e.g., connections to each of phases A, B, C, and N, in the depicted embodiment). U.S. patent application Ser. No. 11/003,064, hereby incorporated by reference into the present disclosure, details some methods of coupling digital electrical power and energy meters to various electrical services. The connections of the interfaces 111, 113 may be, for example, screw-type connections, blade-jaw connections, etc. Those of ordinary skill in the art will be familiar with other methods for coupling meters to electrical services, thus these methods need not be described further in this patent.

Figure 3:
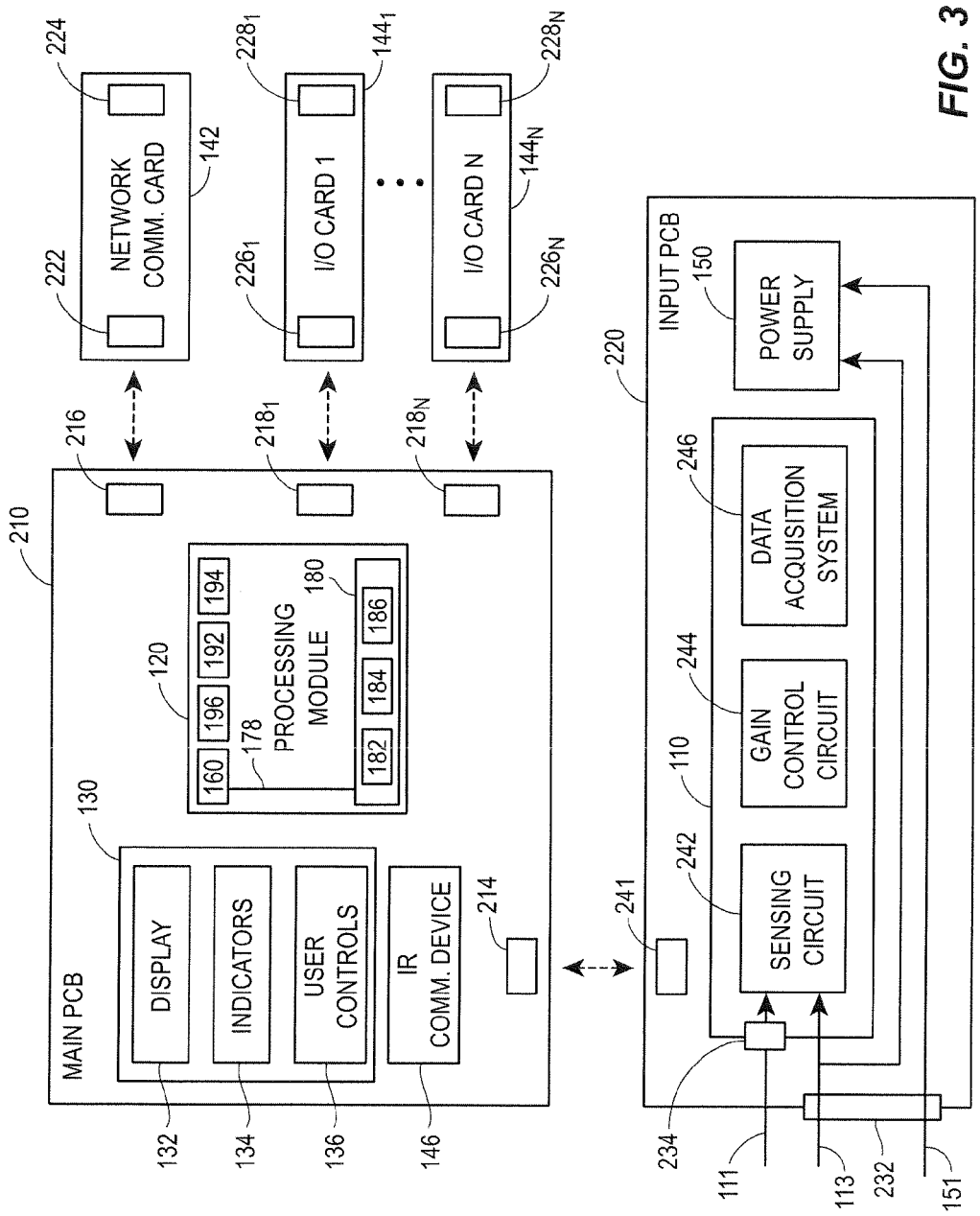
FIG. 3 is a block diagram illustrating the circuit configuration of the meter of FIGS. 1A and 1B.

FIG. 3 shows a plurality of PCBs 210, 220, 142, and $144_1$-$144_N$. In one embodiment, one of the PCBs is a main PCB 210, or motherboard, comprising a multi-layer PCB. The motherboard 210 comprises a plurality of electrical and electronic parts, disposed on each of its two planar surfaces 133, 135 (see FIG. 7). As used herein, the term "motherboard" denotes a central or primary circuit board, and may also be referred to interchangeably as a mainboard, a baseboard, a backplane, or a system board. The motherboard 210 connects the primary circuitry, in this case the processing module 120, to the other functional blocks of the meter 100. In particular, each of an input PCB 220, the network communication card 142, and any included I/O cards $144_1$-$144_N$ connect to the system through the motherboard 210.

Various components, e.g., connectors, modules, etc., are coupled to the motherboard 210 via surface mount technology. Surface mount technology (SMT) is a method for constructing electronic circuits in which the components (SMC, or Surface Mounted Components) are mounted directly onto the surface of the printed circuit board (PCB) avoiding the necessity of thru-holes. An SMT component is usually smaller than its through-hole counterpart because it has either smaller leads or no leads at all for example it may have short pins or leads of various styles, flat contacts, a matrix of balls (BGAs), or terminations on the body of the component. The use of surface mount components allows the motherboard to support or accommodate the user interface, the processing system and the connector for expandable I/O connections. In this exemplary design, the motherboard structural integrity is based on the fact that there are not many through-hole components on the board. Utilizing such through-hole components would render the motherboard to flimsy and thus susceptible to bending. This bending action would cause the solder components of the display and processing system to possible crack the solder connections to the components thereon.

Figure 4A:
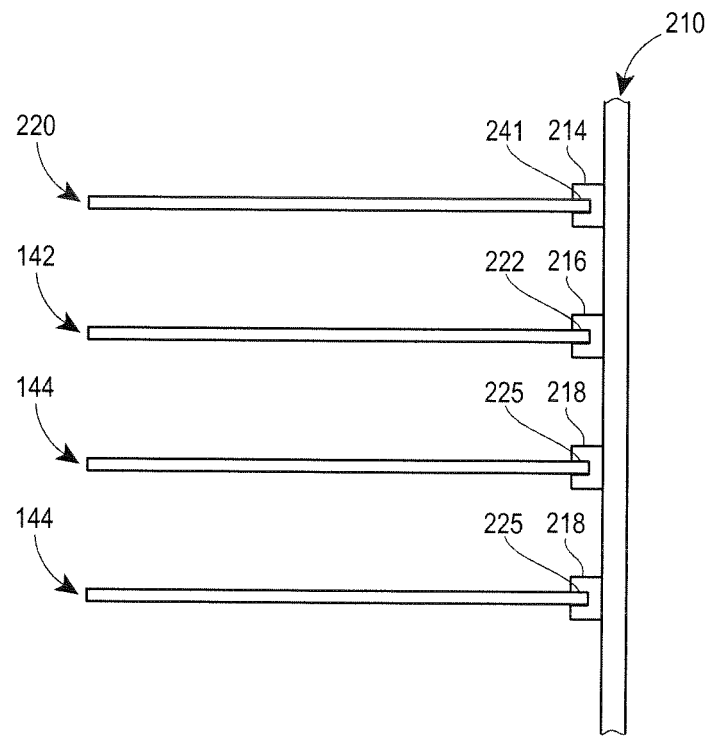
FIGS. 4A and 4B depict two embodiments of the printed circuit boards comprising the exemplary meter of FIGS. 1A and 1B.
Figure 4B:
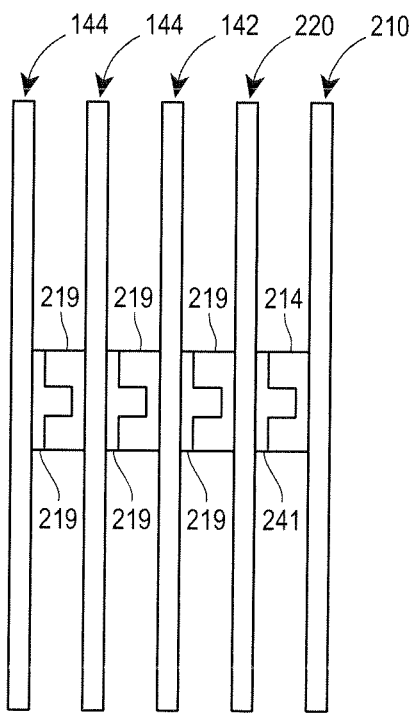

In one embodiment, each of the processing module 120, the user interface module 130 (i.e., the display 132, the indicators 134, the user controls 136, and associated hardware (not shown), described below), and the infrared communication device 146 of the communications module 140 are disposed on the motherboard 210. In particular, the user interface module 130 and the infrared communication device 146 are disposed on one side of the motherboard 210, while the processing module 120 is disposed on the opposite side of the motherboard 210. Also disposed on the motherboard 210, on the same side as the processing module 120, are a plurality of connectors 214, 216, and $218_1$-$218_N$, for connecting the motherboard 210 to the input PCB 220 via a connector 241, the network communication card 142 via a connector 222, and the I/O cards $144_1$-$144_N$ via a plurality of connectors $226_1$-$226_N$, respectively. Each of the connectors 214, 216, and $218_1$-$218_N$, which mate with the connectors 241, 222, and $226_1$-$226_N$, respectively, may be any type of appropriate connector. This arrangement allows the user interface module 130 and the infrared communication device 146 to be disposed such that they face the outside of the meter 100 (i.e., so the user interface 130 is visible to a user of the meter 100), while the processing module 120 and the plurality of connectors 214, 216, and 218 project toward the inside of the meter 100 to allow the interface cards 220, 142, and 144 to connect thereto. Of course, FIG. 4A depicts each of the interface cards 220, 142, and 144 being perpendicular to the motherboard 210 (and, thus, parallel to each other), the motherboard 210 and interface cards 220, 142, and 144 could also be disposed in parallel, with each card being communicatively coupled to the motherboard 210 via any intervening connectors 219 (and PCBs) between any card and the motherboard 210, as in FIG. 4B. In the embodiment of FIG. 4B, each of the interface cards 220, 142, 144 would have one or more connectors on each planar surface, allowing connections to other cards on both sides.

Referring again to FIG. 3, the power supply 150 and the metering module 110 are each disposed on the input PCB 220. As described above, either the interface 151 or the interface 113 couples the power supply 150 to either the electrical service 101 or an external power source (not shown). A connector 232 may be provided on the input PCB 220 for coupling the input PCB 220 to the voltage interfaces 113 and/or 151. A similar connector 234 may be provided on the input PCB 220 for coupling the metering module 110 on the input PCB 220 to the current interface 111.

In one embodiment, the metering module 110 on the input PCB 220 includes a sensing circuit 242, for sensing the voltages and currents on each of the supply lines A, B, C, and N of the electrical service 101, and generating analog signals representative of the voltages and currents. The metering module 110 also includes a gain control unit 244. The input to the gain control unit 244 is the output of the sensing circuit 242 (i.e., the plurality of voltage and current signals representative of the voltages and currents on supply lines A, B, C, and N of electrical service 101). The output of the gain control unit 244 is a plurality of analog signals proportional to the input signals, and adjusted by a gain factor. The gain factor need not be the same for each of the signals. The gain-adjusted output signals of the gain control unit 244 serve as the input signals to a data acquisition system 246. The data acquisition system 246 includes an analog-to-digital converter (not shown) for converting the analog signals to digital data streams and a processor (not shown) for measuring or calculating a parameter of the electrical system 101.

The processing module 120, includes a processor 160 (e.g., a micro-processor, a digital signal processor (DSP), etc.) and a memory module 180 having one or more computer-readable storage devices (e.g., memories). For example, the memory module 180 may include an electrically erasable programmable read-only memory (EEPROM) 182, a flash memory 184, and/or a random access memory (RAM) 186. An interface 178 connects the processing module 120 to the memory module 180. The interface 178 may be any known interface compatible with both the particular memory devices 182, 184, 186 and the particular processor 160. The processing module 120 may also include additional elements, such as a real-time clock 196, a backup power source (e.g., a battery) 194, and various other support circuitry 192.

The communication module 140 comprises the network communication card 142, and each of any I/O cards 144 included in the meter 100. Each card of the communication module 140 includes circuitry adapted to the particular configuration contemplated by the manufacturer and/or purchaser. For example, the network communication card 142 may be an Ethernet card, including an Ethernet chipset and an RJ-45 receptacle, as well as other auxiliary hardware supporting the Ethernet communications and allowing the network communication card 142 to interface with the processing module 120 on the motherboard 210. Alternatively, the network communication card 142 may be a fiber optic card having hardware associated with such a card (e.g., fiber optic transceivers, etc.). The network card shall be capable of supporting a host of protocols including but not limited to FTP, HTTP, Modbus TCP, DNP over Ethernet, IEC 61850, and a host of email functions. Said email functions include the ability to send of receive emails consisting of data, computer readable information or simple text messages. Additionally, said email functions also include the ability to provide new programmable settings to the IED, new processor firmware (e.g., embedded software used to run the processor in the processing system) or any other power management or control events. The network communications card 142 may be configured to communicate using any known protocol, including, for example, 10/100BaseT Ethernet, RS-485, Modbus, DNP 3.0, etc. The network communications card 142 may also be configured to output a KYZ energy pulse output.

In a similar manner, each of the I/O cards 144 may be configured to communicate with other devices including, by way of example and not limitation, a 10/100BaseT Ethernet I/O card, a Modbus/TCP I/O card, an analog I/O card (e.g., outputting 0-1 mA, 4-20 mA, 0-5 V, etc.), a relay I/O card, a solid-state I/O card, or a fiber optic I/O card. In general, the network communication card 142 and the I/O cards 144 may be any known type of network communication card or I/O card. Further, each of the network communication card 142 and the I/O cards 144 includes at least one connector 222, 226 for connecting the network communication card 142 or the I/O card 144 to the processing module 120 on the motherboard 210 though the corresponding mating connector 216, 218. Each card (excluding input PCB 220) also includes at least one connector 224, 228 for connecting the card to a device (not shown) external to the meter 100 (e.g., a relay, a slave device, fiber optic cable, Cat-5 cable, etc.). It shall be noted that the interface cards can utilize the printed circuit board itself to operate as a connector so that the motherboard will accept an "edge" connector in which the connector accepts the input of the printed circuit board itself to create the connection between the motherboard and the interface cards.

The network communication card 142 and the I/O cards 144 communicate with the processing module 120 on the motherboard 210 and, in particular, with a processor in the processing module 120 (e.g., a microprocessor, a digital signal processor (DSP), etc.), using one or more serial data interfaces. The serial data interfaces may be any known interface, including a serial peripheral interface (SPI) or an RS-485 interface. By communicating with the processing module 120, the communication module 140 (i.e., the communication card 142 and/or the I/O cards 144) allows the meter 100 to send results of measurements and/or calculations performed in either of the processing module 120 or the metering module 110, to an external device, and may optionally allow the meter 100 to send to or receive from an external device the configuration settings of the meter 100.

Figure 5:
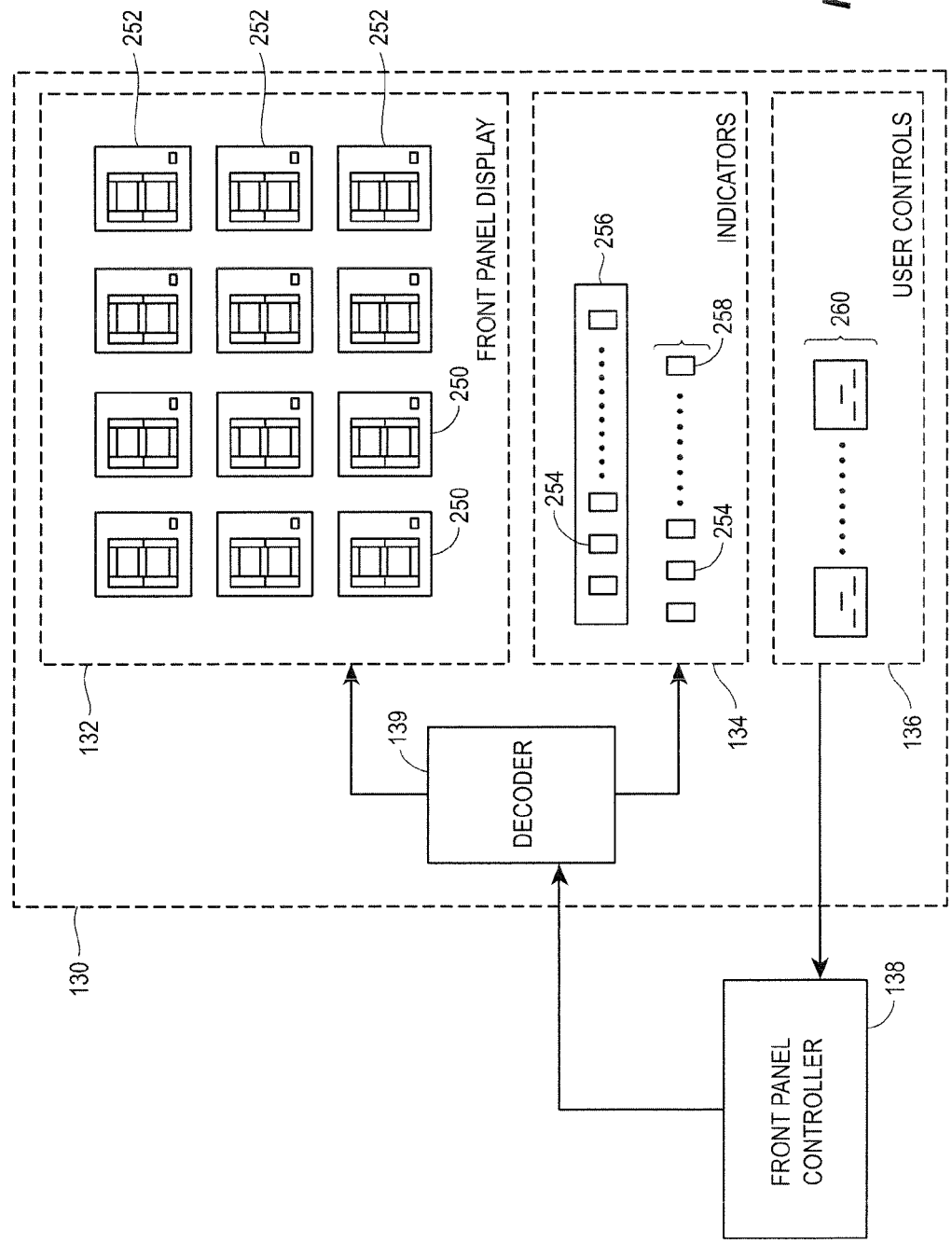
FIG. 5 is a schematic view of an exemplary user interface module in accordance with the present disclosure.

Referring now to FIG. 5, the user interface module 130 includes the front panel display 132, the indicators 134, and the user controls 136. The user interface module 130 may also include various support circuitry, such as a controller 138 and a decoder 139. The infrared communication device 146 may also be disposed on the motherboard 210 with the user interface module 130 and, in as much as it allows a user to program or receive data from the meter 100, may also be said to be included in the user interface module 130. The front panel display 132 may be any type of suitable display technology (e.g., liquid crystal display (LCD), light emitting diode (LED), organic light emitting diode (OLED), etc.). In the depicted embodiment, the display 132 includes a plurality of LED segments 250, and each of the segments 250 is capable of displaying a single alpha-numeric character (including numbers 0-9 and at least some letters or recognizable portions thereof) and a decimal point. The LED segments 250 are arranged such that they may, as a group, display one or more lines 252 of numeric data or text. For example, the LED segments 250 may be arranged into three lines 252, each of the lines 252 displaying data for one of the three phases of the electrical system 101. In this arrangement, the LED segments 250 may also be used to display text (e.g., for displaying menu options of the meter 100 or indicating error messages).

The indicators 134 of the user interface 130, as implemented in the illustrated embodiment, include a plurality of LEDs 254. The plurality of LEDs 254 may be grouped in any appropriate manner. For example, some of the LEDs 254 may be grouped together to form a status bar 256 for indicating a relative quantity (e.g., % load). Others of the LEDs 254 may indicate which of the various parameters (e.g., Volts, Amps, watthours, reactive power, etc.) measured or calculated by the meter 100 is currently being displayed by the display 132, or indicate information about the parameter being displayed, such as the units of measurement (i.e., kilo or mega), or whether the value displayed is a minimum, maximum, programmable limit, etc. A watthour pulse 258 may also be included.

The user controls 136 of the user interface module 130 include a plurality of buttons 260 for allowing the user to navigate menus, set meter preferences, select which measurements to view, etc. Of course, the buttons 260 may include any appropriate buttons for these purposes, including a "menu" button, navigation arrow buttons, a "select" button, and any other buttons necessary to control the meter 100. In addition to, or instead of, the buttons 260, the user controls 136 may also comprise a touch screen integrated with the display 132, such as when the display 132 is an LCD display. In the illustrated embodiment, the user controls 136 are multi-functional push-buttons, which buttons' functions may be programmed according to the particular commands being entered, or according to the options being displayed on the front panel display 132.

Figure 6:
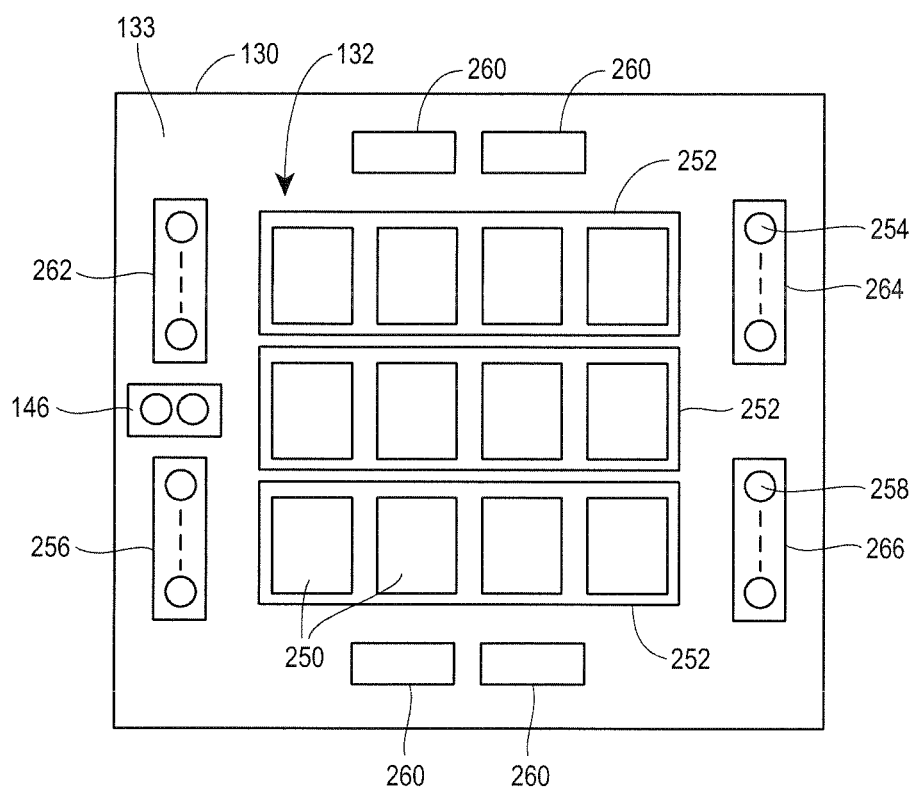
FIG. 6 is a block diagram illustrating an exemplary layout of the user interface module of FIG. 5.

Referring now to FIG. 6, the user interface module 130 may be arranged in any suitable fashion. In the depicted embodiment, the display 132 is disposed in the center of a face 133 of the meter 100. The plurality of LEDs 254 comprising the indicators 134 of the user interface 130, are disposed on the left and right sides of the display 132. For example, the group of LEDs 254 comprising the status bar 256 is disposed along the lower left of the display 132. A group of LEDs 262 is disposed along the upper left of the display 132 to indicate whether the values on the display are indicative of a reading type (e.g., a minimum, a maximum, % total harmonic distortion, etc.), whether the meter 100 is in a programming mode, etc. The infrared communication device 146 is disposed to the left of the display 132, between the status bar 256 and the LEDs 262. A third group of LEDs 264 is disposed along the upper right of the display 132 to designate the parameter displayed on the display 132 (e.g., Volts, Amps, Wh, etc.). A fourth group of LEDs 266, including the Watthour pulse 258, is disposed along the lower right of the display 132. The fourth group of LEDs 266 indicates the scaling factor of the information displayed on the display 132 (e.g., kilo, mega, etc.). Of course, the indicators 134 need not be separate from the display 132. Instead, the display 132 could display the data and/or information indicated by the indicators 134 where, for example, the display 132 is an LCD display with sufficient resolution and size to show all of the desired information. In the depicted embodiment, the buttons 260 comprising the user controls 136 are disposed along the top and bottom of the face 133 of the meter 100, above and below the display 132. However, the indicators 134 and user controls 136 need not be arranged as described here, but may be arranged in any manner according to the desire of the manufacturer.

Figure 7:
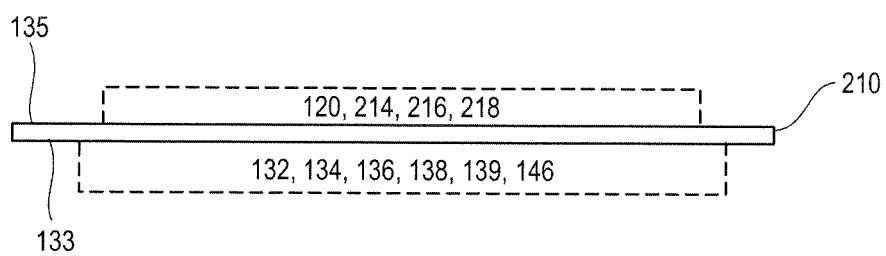
FIG. 7 is a side elevation view of a motherboard of the exemplary digital electrical power and energy meter of FIGS. 1A and 1B.

As described above, each of the processing module 120, the user interface module 130 and the infrared communication device 146 of the communications module 140 are disposed on the motherboard 210. With reference to FIG. 7, the motherboard 210 has two planar surfaces (or faces) including the first planar surface or face 133 and a second planar surface or face 135. In the illustrated embodiment, the user interface module 130 and the infrared communication device 146 are disposed on the first face 133 of the motherboard 210. The processing module 120 is disposed on the second face 135 of the motherboard 210, as are the plurality of connectors 214, 216, and 218. By utilizing surface mount technology, embedded electrical connections (not shown) in the motherboard PCB 210 serve to connect the user interface 130, and its attendant support circuitry, to the processing module 120. When disposed in the housing 105, the first surface 133 of the motherboard 210 will face the cover or opening 107 and the second surface 135 of the motherboard 210, including connectors 214, 216 and 218, will face the rear portion of the housing toward openings 109. In this manner, the single motherboard PCB 210 may be placed at the front of the meter 100, eliminating the need to have a separate PCB for the user interface module 130, and the attendant connectors for interfacing the user interface module 130 to the processing module 120. This necessarily reduces the size of the meter 100, as well as the cost and complexity of assembling the meter 100.

A digital electrical power and energy meter that integrates a primary processing module and a user interface module onto a single printed circuit board has been described. The meter of the present disclosure utilizes surface mount technology to reduce overall meter size, assembly time, and cost. Furthermore, by using surface mount techniques instead of conventional thru-hole techniques, the meter of the present disclosure will realize the following advantages: fewer or no holes are required to be drilled through abrasive boards; small errors in component placement are corrected automatically (e.g, the surface tension of the molten solder pulls the component into alignment with the solder pads); components can be fitted to both sides of the printed circuit board; lower lead resistance and inductance leading to better performance for high frequency parts; better mechanical performance under shake and vibration conditions and fewer unwanted RF signal effects in SMT parts when compared to leaded parts, yielding better predictability of component characteristics.

Although the disclosure herein has been described with reference to particular illustrative embodiments, it is to be understood that these embodiments are merely illustrative of the principles and applications of the present disclosure. Therefore, numerous modifications may be made to the illustrative embodiments and other arrangements may be devised without departing from the spirit and scope of the present disclosure, which is defined by the appended claims.

We claim:

1. A digital electrical power and energy meter comprising:
a housing;
a plurality of interface cards residing within the housing, each interface card comprising a printed circuit board and an electrical mating connector, each electrical mating connector configured to be connected to a surface-mounted connector;
a first one of the plurality of interface cards comprises:
at least one voltage sensor for sensing a voltage signal;
at least one current sensor for sensing a current signal; and
at least one analog to digital converter coupled to said at least one voltage sensor and said at least one current sensor; and
a motherboard residing within the housing, the motherboard comprising:
a first surface and a second surface, the first surface opposing the second surface;
a plurality of surface-mounted connectors disposed on the first surface, each surface-mounted connector receiving the electrical mating connector of a respective one of the interface cards; and
a user interface module disposed on the second surface, the user interface module configured for displaying information to a user and receiving commands from a user.

2. The meter of claim 1, wherein:
the plurality of interface cards are disposed in parallel relation to each other and in perpendicular relation to the motherboard; and
the mating connector on each of the interface cards is disposed along an edge of the printed circuit board of the interface card.

3. The meter of claim 1, wherein:
the plurality of interface cards are disposed in parallel relation to each other and in parallel relation to the motherboard; and
the mating connector on each of the interface cards is disposed on a face of the printed circuit board of the interface card.

4. The meter of claim 1, further comprising:
a metering module capable of measuring or calculating at least one parameter of an AC electrical service;
a processing module capable of administering operation of the meter and processing data obtained by the metering module; and
a communication module capable of communicating with one or more remote devices.

5. The meter of claim 4, wherein:
the metering module is disposed on the first one of the plurality of interface cards;
a first portion of the communication module is disposed on a second one of the plurality of interface cards; and
each of the processing module and a second portion of the communication module is disposed on the motherboard.

6. The meter of claim 4, wherein the communication module further comprises:
a first portion comprising an infra-red communication device and disposed on the motherboard; and
a second portion comprising a network communication module disposed on one of the interface cards.

7. The meter of claim 6, wherein the network communication module supports at least one of Modbus TCP/IP, HTTP, FTP, DNP over Ethernet, IEC 61850 protocol, email functionality and combinations thereof.

8. The meter of claim 6, wherein the second portion of the communication module further comprises at least one input/output module communicatively coupled to the processing module.

9. The meter of claim 8, wherein the at least one input/output module facilitates bi-directional data exchange using any of: analog 0-1 mA signals, analog 4-20mA current loop signals, digital signals, relay contacts, solid-state contacts, fiber-optic signals, a 10/100BaseT Ethernet communication protocol, a Modbus/TCP communication protocol and combinations thereof.

10. A digital electrical power and energy meter comprising:
a housing;
a plurality of interface cards residing within the housing, each interface card comprising a printed circuit board and an electrical mating connector, each electrical mating connector configured to be connected to a surface-mounted connector; and
a motherboard residing within the housing, the motherboard comprising:
a first surface and a second surface, the first surface opposing the second surface;
a plurality of surface-mounted connectors disposed on the first surface, each surface-mounted connector receiving the electrical mating connector of a respective one of interface cards; and
a user interface module disposed on the second surface, the user interface module configured for displaying information to a user and receiving commands from a user,
wherein the plurality of interface cards are disposed in parallel relation to each other and in perpendicular relation to the motherboard, and
wherein the mating connector on each of the plurality of interface cards is disposed along an edge of the printed circuit board of the interface card.

11. A digital electrical power and energy meter comprising:
a housing;
a plurality of interface cards residing within the housing, each interface card comprising a printed circuit board and an electrical mating connector, each electrical mating connector configured to be connected to a surface-mounted connector;
a first one of the plurality of interface cards comprises a metering module, the metering module capable of measuring or calculating at least one parameter of an AC electrical service; and
a motherboard residing within the housing, the motherboard comprising:
a first surface and a second surface, the first surface opposing the second surface;
a plurality of surface-mounted connectors disposed on the first surface, each surface-mounted connector receiving the electrical mating connector of a respective one of the of interface cards;
a processing module disposed on the first surface, the processing module capable of administering operation of the meter and processing data obtained by the metering module; and
a user interface module disposed on the second surface, the user interface module configured for displaying information to a user and receiving commands from a user,
wherein the plurality of interface cards are disposed in parallel relation to each other and in perpendicular relation to the motherboard, and
wherein the mating connector on each of the plurality of interface cards is disposed along an edge of the printed circuit board of the interface card.

12. The meter of claim 11, wherein the housing comprises:
a cover including at least one first opening and a rear portion including at least one second opening,
wherein the housing is configured to support the motherboard such that the first surface of the motherboard faces the at least one second opening and the second surface faces the at least one first opening.

13. The meter of claim 12, wherein a second one of the plurality of interface cards comprising a communication module capable of communicating with one or more remote devices, wherein the second one of the plurality of interface cards is disposed through the at least one second opening.

14. The meter of claim 11, wherein the plurality of connectors, the processing module, and the user interface module are surface mounted to the motherboard.

15. A digital electrical power and energy meter comprising:
a housing having a cover including at least one first opening and a rear portion including at least one second opening, the first opening opposing the second opening; and
a motherboard residing within the housing, the motherboard comprising:
a single printed circuit board having a first surface and a second surface, the first surface opposing the second surface;
a user interface module disposed on the first surface, the user interface module configured for displaying information to a user and receiving commands from a user;
a processing module disposed on the second surface, the processing module capable of administering operations of the meter, the processing module being communicatively coupled to the user interface module; and
a plurality of surface-mounted connectors disposed on the second surface, each of the surface-mounted connectors receiving an electrical mating connector of a respective one of a plurality of interface cards, the plurality of surface-mounted connectors being communicatively coupled to the processing module,
wherein the housing is configured to support the motherboard such that the first surface of the motherboard faces the at least one first opening for exposing the user interface module through the at least one first opening and the second surface faces the at least one second opening for receiving the plurality of interface cards through the at least one second opening.

16. The digital electrical power and energy meter of claim 15, wherein a first one of the plurality of interface cards comprises a metering module, the metering module capable of measuring or calculating at least one parameter of an AC electrical service, the first one of the plurality of interface cards being disposed in perpendicular relation to the motherboard.

17. The meter of claim 1, wherein each surface-mounted connector includes at least one ball lead for coupling the surface-mounted connector to the first surface.

18. The meter of claim 10, wherein each surface-mounted connector includes at least one ball lead for coupling the surface-mounted connector to the first surface.

19. The meter of claim 11, wherein each surface-mounted connector includes at least one ball lead for coupling the surface-mounted connector to the first surface.

20. The meter of claim 15, wherein each surface-mounted connector includes at least one ball lead for coupling the surface-mounted connector to the second surface.

21. The meter of claim 1, wherein a second one of the plurality of interface cards comprises a communication module capable of communicating with one or more remote devices.

22. The meter of claim 21, wherein the communication module supports at least one of Modbus TCP/IP, HTTP, FTP, DNP over Ethernet, IEC 61850 protocol, email functionality and combinations thereof.

23. The meter of claim 10, wherein a first one of the plurality of interface cards comprises a communication module capable of communicating with one or more remote devices.

24. The meter of claim 23, wherein the communication module supports at least one of Modbus TCP/IP, HTTP, FTP, DNP over Ethernet, IEC 61850 protocol, email functionality and combinations thereof.

25. The meter of claim 13, wherein the communication module supports at least one of Modbus TCP/IP, HTTP, FTP, DNP over Ethernet, IEC 61850 protocol, email functionality and combinations thereof.

26. The meter of claim 15, wherein a first one of the plurality of interface cards comprises a communication module capable of communicating with one or more remote devices.

27. The meter of claim 26, wherein the communication module supports at least one of Modbus TCP/IP, HTTP, FTP, DNP over Ethernet, IEC 61850 protocol, email functionality and combinations thereof.

28. The meter of claim 10, wherein a first one of the plurality of interface cards comprises at least one input/output (I/O) module capable of communicating with one or more remote devices.

29. The meter of claim 28, wherein the at least one input/output module facilitates bi-directional data exchange using any of: analog signals, digital signals, relay contacts, solid-state contacts, fiber-optic signals, a 10/100BaseT Ethernet communication protocol, a Modbus/iTCP communication protocol and combinations thereof.

30. The meter of claim 11, wherein a second one of the plurality of interface cards comprises at least one input/output (I/O) module capable of communicating with one or more remote devices.

31. The meter of claim 30, wherein the at least one input/output module facilitates bi-directional data exchange using any of: analog signals, digital signals, relay contacts, solid-state contacts, fiber-optic signals, a 10/100BaseT Ethernet communication protocol, a Modbus/TCP communication protocol and combinations thereof.

32. The meter of claim 15, wherein a first one of the plurality of interface cards comprises at least one input/output (I/O) module capable of communicating with one or more remote devices.

33. The meter of claim 32, wherein the at least one input/output module facilitates bi-directional data exchange using any of: analog signals, digital signals, relay contacts, solid-state contacts, fiber-optic signals, a 10/100BaseT Ethernet communication protocol, a Modbus/TTCP communication protocol and combinations thereof.

34. The meter of claim 1, wherein the user interface module includes a display, the display comprising at least one of a liquid crystal display (LCD), a light emitting diode (LED) display, an organic light emitting diode (OLED) display and combinations thereof.

35. The meter of claim 10, wherein the user interface module includes a display, the display comprising at least one of a liquid crystal display (LCD), a light emitting diode (LED) display, an organic light emitting diode (OLED) display and combinations thereof.

36. The meter of claim 11, wherein the user interface module includes a display, the display comprising at least one of a liquid crystal display (LCD), a light emitting diode (LED) display, an organic light emitting diode (OLED) display and combinations thereof.

37. The meter of claim 15, wherein the user interface module includes a display, the display comprising at least one of a liquid crystal display (LCD), a light emitting diode (LED) display, an organic light emitting diode (OLED) display and combinations thereof.

* * * * *